United States Patent [19]

Sasaki et al.

[11] Patent Number: 5,063,579
[45] Date of Patent: Nov. 5, 1991

[54] SCALER FOR SYNCHRONOUS DIGITAL CLOCK

[75] Inventors: Lawrence H. Sasaki, Manotick; Sun-Shiu D. Chan, Kanata, both of Canada

[73] Assignee: Northern Telecom Limited, Montreal, Canada

[21] Appl. No.: 524,398

[22] Filed: May 11, 1990

[51] Int. Cl.⁵ .......................................... H03K 21/38
[52] U.S. Cl. ...................................... 377/48; 377/52; 377/55; 377/108
[58] Field of Search ................... 377/33, 52, 55, 108, 377/110, 48

[56] References Cited

U.S. PATENT DOCUMENTS

| | | | |
|---|---|---|---|
| 4,041,403 | 8/1977 | Chiapparoli | 377/111 |
| 4,495,630 | 1/1985 | Thompson et al. | 377/110 |
| 4,587,664 | 5/1986 | Iida | 377/48 |
| 4,658,406 | 4/1987 | Pappas | 377/48 |
| 4,935,944 | 6/1990 | Everett | 377/110 |
| 4,942,595 | 7/1990 | Baca | 377/48 |

Primary Examiner—John S. Heyman
Attorney, Agent, or Firm—John E. Mowle

[57] ABSTRACT

A scaler comprising a plurality of flip-flops, varies its frequency division to correct phase by 0.5 clock cycle. Each flip-flop is continuously and synchronously responsive to either a rising or a falling edge of the clock pulses. Normally, the scaler's state transits along one of two loops, which generate output pulses having identical repetition rates. When a control signal is applied, the scaler's state transits from one loop to the other, generating at least one output at an alternative repetition rate. The alternative repetition rate is either lower or higher than the identical repetition rate by an integral number of half cycles of the input clock pulses. Where there are two control signals, a lower or higher alternative repetition rate can be selected. Since the flip-flops are responsive to either edge of the clock pulses without clock gating interruptions, there is no jitter and the scaler's robustness is improved. Also the clock frequency can be effectively halved.

4 Claims, 5 Drawing Sheets

SCALER FOR SYNCHRONOUS DIGITAL CLOCK

FIELD OF THE INVENTION

The present invention relates to a scaler having a selectably variable modulus, and more particularly to a prescaler in a phase-locked loop of a synchronous digital clock supply.

BACKGROUND OF THE INVENTION

In telecommunication systems, digital clock supplies are commonly used to generate local clock signals which are synchronized to incoming signals on transmission lines. A well-known technique employs a high-speed scaler driven by an internal free running local clock, whose modulus is varied in accordance with external control signals, to provide phase correction of the output clock signals of the scaler, thereby maintaining synchronization. The frequency of the internal free running clock pulses, is nominally a multiple of the clock pulses. Typically, when the scaler's division is changed, a phase correction of ±0.5 internal clock cycle occurs.

In a typical prior art system having flip-flops, the internal clock pulses are inverted under control of the external control signals, to provide this phase correction. This has the effect of momentarily interrupting the internal clock pulses applied to the flip-flops, by shifting their phase by 180°. The result is that the scaler effectively responds to rising then falling edges of the internal clock pulses with each inversion, even though the output of the internal clock remains uninterrupted. In one such application, a divide-by-2 scaler, comprising a plurality of flip-flops, provides one output pulse for every two input clock pulses. As its modulus is changed from 2 to 1.5 or 2.5, it provides ±90 degree phase correction of the output clock signals. In high speed clock applications, where the internal clock runs at a frequency of typically 20 MHz or higher, interrupting the internal clock signal applied to the flip-flops tends to generate signal jitter on the output clock, due to settling times of the associated gates controlling the interruptions. Because of this jitter, the operation of the flip-flops can malfunction.

SUMMARY OF THE INVENTION

Accordingly, the present invention provides a variable modulus scaler, utilizing flip-flops that are continuously and synchronously clocked (without gated interruptions) so as to avoid any jitter caused by gated clock signals, thereby providing improved robustness.

The present invention also provides a scaler in which alternate sets of flip-flops are continuously clocked by alternate clock edges, so that the clock speed can be effectively halved relative to scalers where all flip-flops are clocked by the same clock edges.

The present invention additionally provides a scaler whose modulus is selectably variable by ±0.5 clock cycle.

According to the most general aspect of the present invention, a scaler having a selectively variable modulus, for receiving input clock pulses and generating a train of output pulses, comprises: first and second sets of flip-flops responsive only to rising and falling edges respectively, of the input clock pulses; and a plurality of gates interconnected with the flip-flops to control the scaler's state. In the scaler, the scaler transits along one of two loops, each loop generating output pulses having identical repetition rates and being shifted in phase relative to each other by an integral number of half cycles of the input clock pulses; and the scaler's state transits in response to a control signal, from one of the two loops to the other, so as to generate at least one output pulse at an alternative repetition rate, which differs from the identical repetition rates by an integral number of half cycles of the input clock pulses.

When the control signal is a set of first and second control signals and each of the sets of flip-flops has two flip-flops, the scaler's state is continuously changed in response to the input clock pulses, as it transits along one of the two loops without changing the state of one flip-flop of each set. The alternative repetition rate, in response to the first and second control signals respectively, includes first and second repetition rates. The first and second repetition rates are lower and higher, respectively, than the identical repetition rates.

Preferably, the pattern according to the identical repetition rates is "1-0-1-1" and according to the first and second repetition rates are "1-0-1" and "1-0-1-1-1", respectively. The scaler's frequency division is 2 corresponding to the identical repetition rates and is 1.5 and 2.5 corresponding to the first and second repetition rates, respectively.

BRIEF DESCRIPTION OF THE DRAWINGS

An embodiment of the present invention will now be described by way of example only with reference to the accompanying drawings in which.

DETAILED DESCRIPTION OF THE PREFERRED EMBODIMENT

Figure 1:
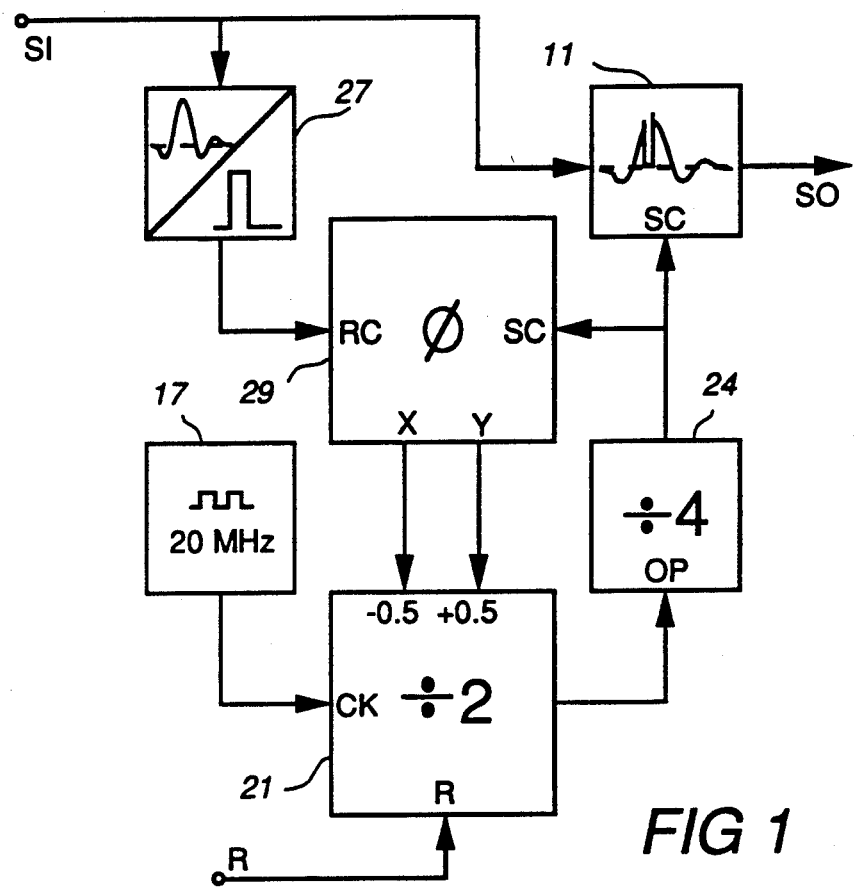
FIG. 1 is a block diagram of a phase correction circuit which utilizes a scaler according the present invention.

Referring to FIG. 1, the phase correction circuit comprises a signal sampler 11 which receives an incoming a bit rate of 2.5 Mbps and samples it to signal SI having a bit rate of 2.5 Mbps and samples it to provide an outgoing signal SO. A free running clock generator 17 provides internal clock pulses CK at a frequency of 20 MHz to a scaler 21, which functions as a finite state machine, having a selectably variable frequency division: 2 or 2±0.5. The scaler 21, initialized by a reset pulse R, counts the internal clock pulses CK and normally functions as a divide-by-2 frequency divider to provide output clock pulses OP at a frequency of 10 Mhz to a divide-by-4 frequency divider 24 which in turn supplies sampling clock pulses SC to the signal sampler 11 and a phase comparator 29. The frequency of the sampling clock pulses SC is 2.5 MHz (2.5 Mbps), the same as that of the incoming signal SI.

For accurate sampling, the phase of the incoming signal pulses SI, relative to that of the sampling clock pulses SC, must be precisely maintained. Due to asynchronization, a slow drift in the relative phase of the two signals can occur. This is detected by the phase comparator 29, which in turn generates either a control signal X or Y, that is then applied to the scaler 21 to initiate phase correction. To effect correction, the frequency division of the scaler 21 is momentarily changed from 2 to 1.5 or 2.5 in response to the control signal X or Y, respectively. This variation of ±0.5, which corresponds to a 0.5 internal clock cycle or 180° phase shift, changes the phase of the output clock pulses OP by ±0.25 cycle or ±90°. Following the divide-by-4 frequency divider 24, the minimum correction for the sampling clock pulses SC is ±0.0625 cycle or ±22.5°.

As shown in FIG. 1, in response to the incoming signal SI, a clock regenerating circuit 27 produces regenerated clock pulses RC having a frequency of 2.5 MHz. The phase comparator 29 then compares the phase of the regenerated clock pulses RC with that of the sampling clock pulses SC, to determine whether the phase of the latter should be corrected. When the phase of the sampling clock pulses SC lags or leads that of the regenerated clock pulses RC by more than a predetermined difference or threshold, the phase comparator 29 generates either the control signal X or Y, respectively. This threshold phase difference is small enough to avoid sample timing errors occurring in the signal sampler 11. When the control signal X or Y is applied to the scaler 21, it alters the frequency division of the output pulse OP. Accordingly, whenever the phase difference between the clock pulses SC and RC exceeds the threshold, the phase of the output clock pulses OP is corrected immediately by momentarily altering the frequency division of the scaler 21 and hence the phase of the sampling clock pulses SC.

Figure 2:
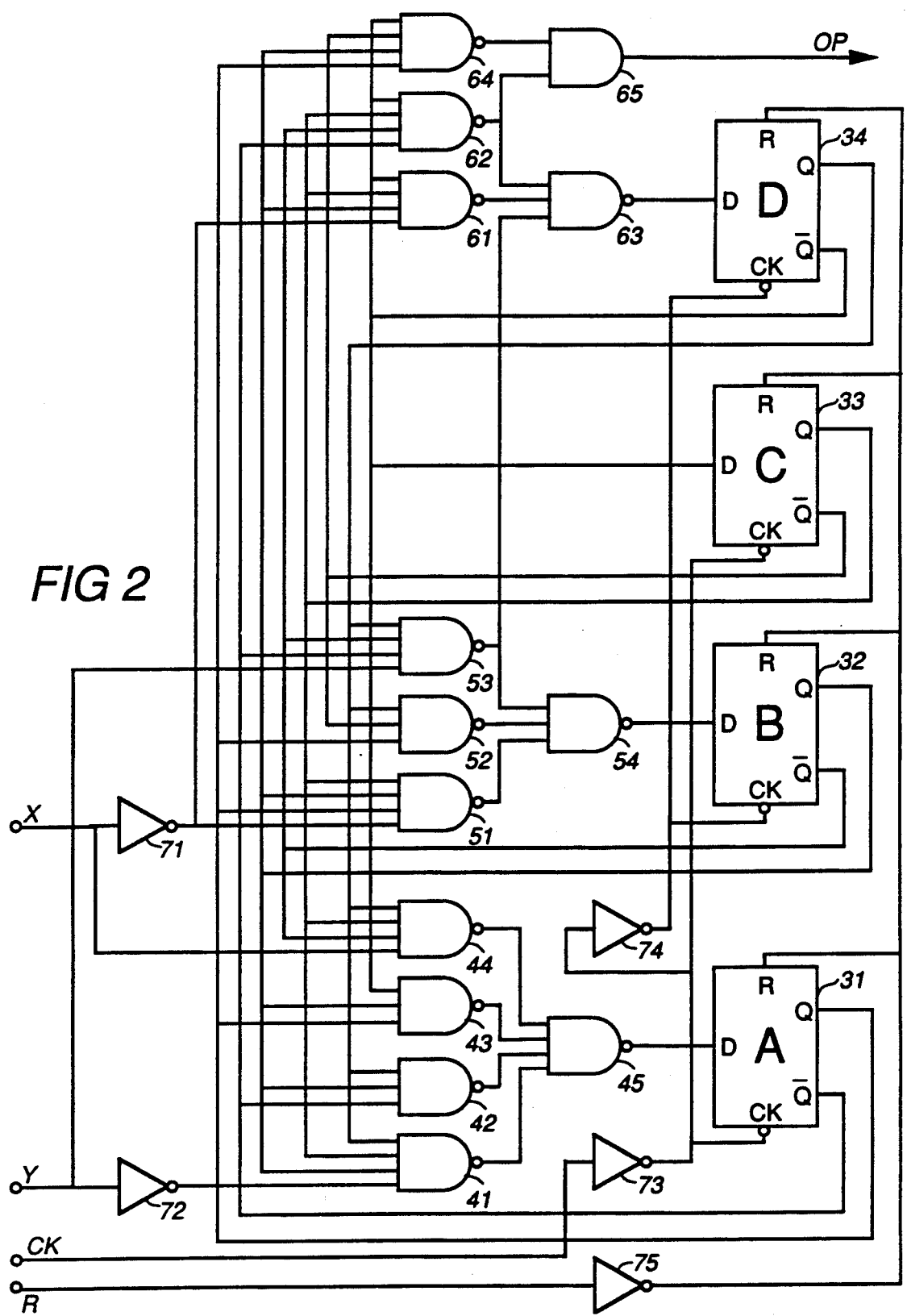
FIG. 2 is a block diagram of the scaler according to the present invention.

FIG. 2 shows in detail the scaler 21, which includes four D-type flip-flops (hereinafter referred to as FFs) 31, 32, 33 and 34 (having logic states A, B, C and D), gating logic circuits and an output decoder, which coact to function as a finite state machine. One gating logic circuit consists of five NAND gates 41, 42, 43, 44 and 45, whose output is connected to the D input of the FF 31. Another gating logic circuit consists of four NAND gates 51, 52, 53 and 54, whose output is connected to the D input of the FF 32. Yet, another gating logic circuit consists of three NAND gates 61, 62 and 63, whose output is connected to the D input of the FF 34. The inverting output of the FF 34 is directly connected to the D input of the FF 33.

The output decoder, comprising a NAND gate 64, an AND gate 65 and the NAND gate 62, functions to decode the scaler's state Q as determined by the FFs 31—34, so as to provide digital output clock pulses OP. Both non-inverting and inverting outputs of the FFs 31-34 are connected to the gating logic circuits and the output decoder as shown in FIG. 2.

When the control signal X from the phase comparator 29, is applied to the NAND gate 44 and to both the NAND gates 51 and 61 through an inverter 71, the scaler's division is changed from 2 to 1.5. When the control signal Y from the phase comparator 29, is applied to the NAND gate 53 and to the NAND gate 41 through an inverter 72, the scaler's division is changed from 2 to 2.5.

During such operating conditions of the scaler 21, the signal logic applied to each D input of the FFs 31-34 is as follows:

The output logic of the output decoder which generates the output clock pulses is:

$$OP = \overline{A}.B + A.\overline{B} + \overline{A}.\overline{C} + A.C + D$$

The FFs 31-34 are clocked by the internal clock pulses CK, provided by the clock generator 17. The internal clock pulses CK are inverted by an inverter 73 and applied to the inverting clock inputs CK of two FFs 31 and 33. Furthermore, the output pulses of the inverter 73 are re-inverted by another inverter 74 and its output is applied to both inverting clock inputs CK of two FFs 32 and 34. Thus, one pair of FFs 31 and 33 always responds to the rising edges while the other pair of FFs 32 and 34 always responds to the falling edges of the internal clock pulses CK, respectively. With this arrangement the combined state of the FFs 31-34 can be continuously altered twice each clock cycle, with no interruption of the applied clock pulses through control gating. As a result, the FFs 31-34 are synchronously clocked by both rising and falling edges of the internal clock pulses CK at an effective clock rate of 40 MHz, so that some of the states A, B, C and D of the FFs 31, 32, 33 and 34 can be altered on each edge of the internal clock pulses CK to determine the scaler's state Q. The FF outputs are converted by the output decoder to provide the output clock pulses OP which are either high "1" or low "0". The reset pulse R is applied through an inverter 75 to all reset inputs R of the FFs 31-34.

Each of the control signals X, Y has two states: "1" when active and "0" when inactive. One or other control signal X or Y is active whenever the phase difference between the sampling clock pulses SC and the regenerated clock pulses RC is greater than a preselected threshold. The control signals X and Y are forced when:

$$A.\overline{B}.\overline{C}.D + A.\overline{B}.C.\overline{D} + \overline{A}.B.\overline{C}.D = 1.$$

Depending upon the state of the control signals X and Y, there are three applicable patterns of logic transition of the output clock pulses OP: (i) "1-0-1-1" when X=Y=0; (ii) "1-0-1" when X=1, Y=0; and (iii) "1-0-1-1" when X=0, Y=1.

Table 1 shows the potential logic state transitions of the FFs 31-34 from each current state A, B, C and D to each next state, in response to both rising and falling edges (left and right columns) of the internal clock pulses CK and the various states of the control signals X and Y. As shown in this table, alternative state transitions only occur when the current states are:

"0001", "0011", "1110" and "1111".

§ indicates applicable logic states of the scaler 21. It can be seen that although only some of the 16 possible logic states occur during normal operation, the circuit will always recover should an abnormal state be reached. Table II shows the logic state relationship between the FFs, the scaler, and the output clock pulses OP.

Figure 3:
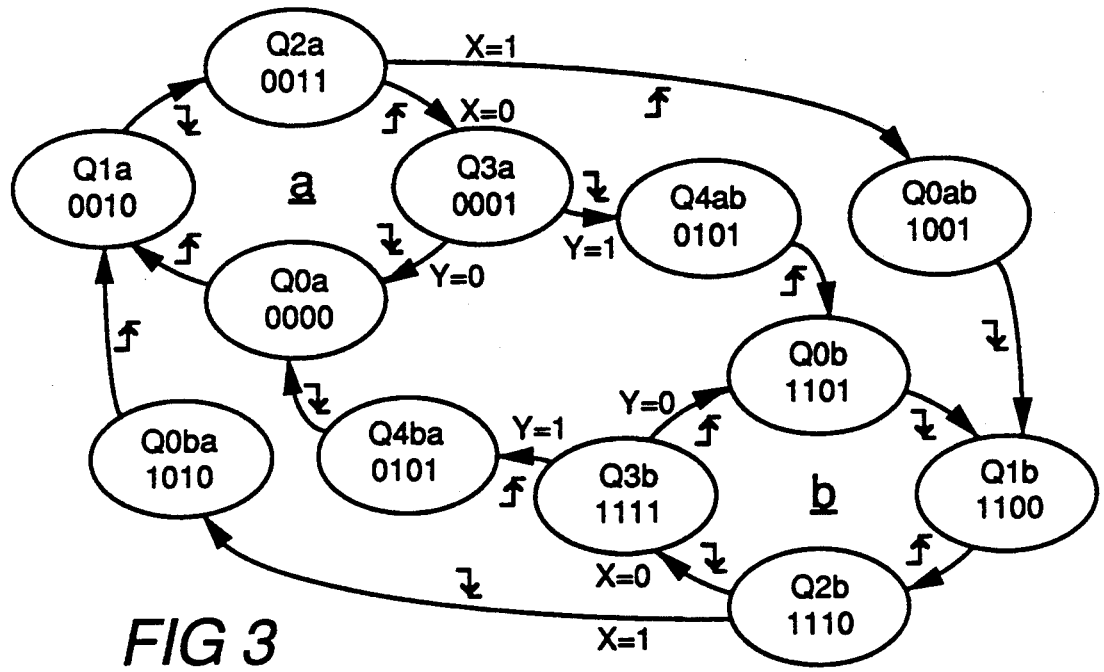
FIG. 3 is a state transition diagram of the scaler shown in FIG. 2.

As shown in the state transition diagram of FIG. 3, the scaler's state Q transits along one of two regular loops unless either control signal X or Y changes its (a) FF 31: $B \cdot C \cdot D \cdot \overline{Y} + \overline{A} \cdot B \cdot D + A \cdot B \cdot \overline{D} + \overline{B} \cdot C \cdot D \cdot X$
(b) FF 32: $A \cdot B \cdot C \cdot \overline{X} + A \cdot \overline{C} \cdot D + \overline{A} \cdot B \cdot D \cdot Y$
(c) FF 33: $\overline{D}$
(d) FF 34: $\overline{A} \cdot B \cdot D \cdot Y + B \cdot C \cdot \overline{D} \cdot \overline{X} + \overline{A} \cdot \overline{B} \cdot C \cdot \overline{D}$ logic state from "0" to "1". Normally, both control signals X and Y cannot be active "X=Y=1" simultaneously. The first regular loop "a" transits are "-Q0a-Q1a-Q2a-Q3a-Q0a- -" and the second regular loop "b" transits are "-Q0b-Q1b-Q2b-Q3b-Q0b- -" as indicated by the suffix numbers. When either the control signal X or Y goes high "1", the scaler's state Q transits from one regular loop to the other through one of "intermediate states": Q0ab, Q4ab, Q0ba or Q4ba. The scaler's state Q never transits from Q0a or Q1a (Q0b or Q1b) to any intermediate state during the first (second) regular loop, regardless of whether or not X or Y is "1" or "0".

Figure 4:
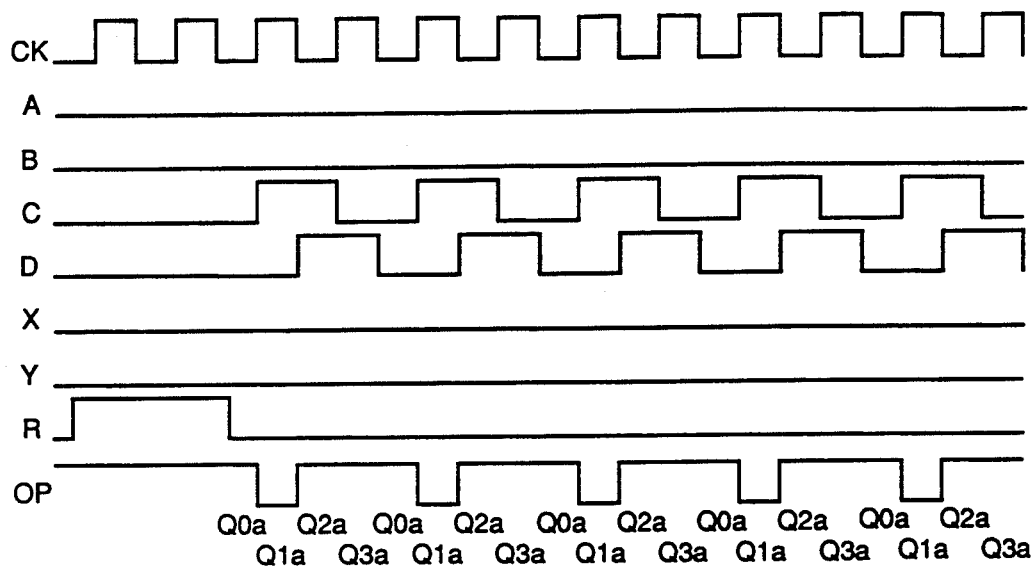
FIGS. 4-9 are timing charts of the scaler shown in FIG. 2.

FIG. 4 shows the scaler's state Q transits following the first regular loop, after the reset pulse R has been applied, when neither control signal is active X=Y=0. Under these conditions, the states A and B of FFs 31 and 32 remain "0", and only the states C and D of FFs 33 and 34 change in response to the rising and falling edges respectively, of the internal clock pulses CK. This results in two transitions of the state Q during one clock cycle. The state Q transits "-Q0a-Q1a-Q2a-Q3a-Q0a-Q1a-Q2a-Q3a- -" resulting in the output clock pulse OP stream "-1-0-1-1-1-0-1-1- -". This decoded pattern "1-0-1-1" of the output clock pulses OP is repeated every two clock cycles. Consequently, the scaler 21 provides one output pulse OP for every two clock pulses CK to continuously function as a divide-by-2 frequency divider.

Figure 5:
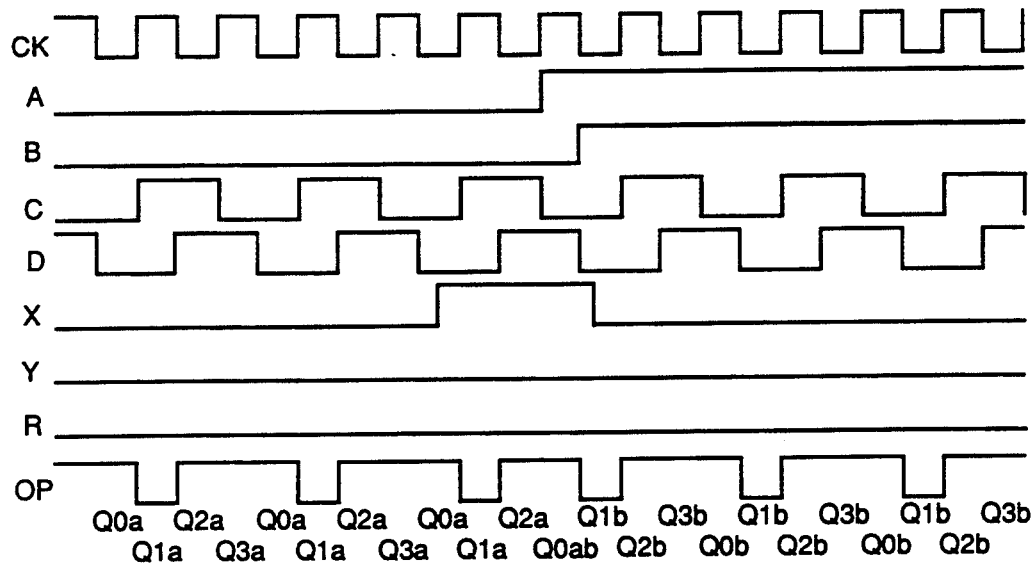

FIGS. 5 shows the scaler's state Q as it transits from the first regular loop "a" to the second loop "b" when the control signal X=1 is applied. When the phase of the sampling clock SC lags that of the regenerated clock RG by more than the preselected threshold, the control signal X goes to "1". The output of the NAND gate 44 goes to "0" at Q2a and the NAND gate 45 changes its output from "0" to "1". The state A of the FF 31 then transits from "0" to "1" in response to the rising edge of the next internal clock pulse CK and the scaler's state Q transits from Q2a to Q2ab as shown in FIG. 3. Thereafter, the NAND gate 52 changes its output from "1" to "0" and the output of the NAND gate 54 transits from "0" to "1". The state B of the FF 32 changes from "0" to "1" in response to the falling edge of the next internal clock pulse CK and simultaneously the state D of the FF 34 changes its state and the scaler 21 transits to Q1b.

Normally only the one intermediate state Q0ab is required to correct the phase shift so that the control signal X again becomes inactive. After the state Q1b is reached, neither of the FFs 31 or 32 continues to change its state (both output remains a "1"), until another phase correction is required. Thereafter, responding to either rising or falling edges of the internal clock pulses CK, the FFs 33 or 34 change their state C or D respectively, and, as shown in FIG. 5, the state Q transits "-Q1b-Q2b-Q3b-Q0b-Q1b-Q2b-Q3b- -" along the second regular loop "b".

Thus, as a result of a single application of the control signal X, the transition states Q, from the first regular loop "a" to the second loop "b", are "-Q0a-Q1a-Q2a-Q3a-Q0a-Q1a-Q2a-Q0ab-Q1b-Q2b-Q3b- -", and the state stream of the output clock pulses OP is "-1-0-1-1-1-0-1-1-0-1- -". During this transition the Q3a state is skipped so that one "1" is deleted in the state pattern of the output clock pulses OP. After one pattern of "1-0-1", the "1-0-1-1" is restored. Since the scaler 21 provides one output pulse during 1.5 clock cycles, it momentarily functions as a divide-by-1.5 frequency divider whenever generating the pattern of "1-0-1". However, it reverts to a divide-by-2 frequency divider when the pattern "1-0-1-1" is restored.

Figure 6:
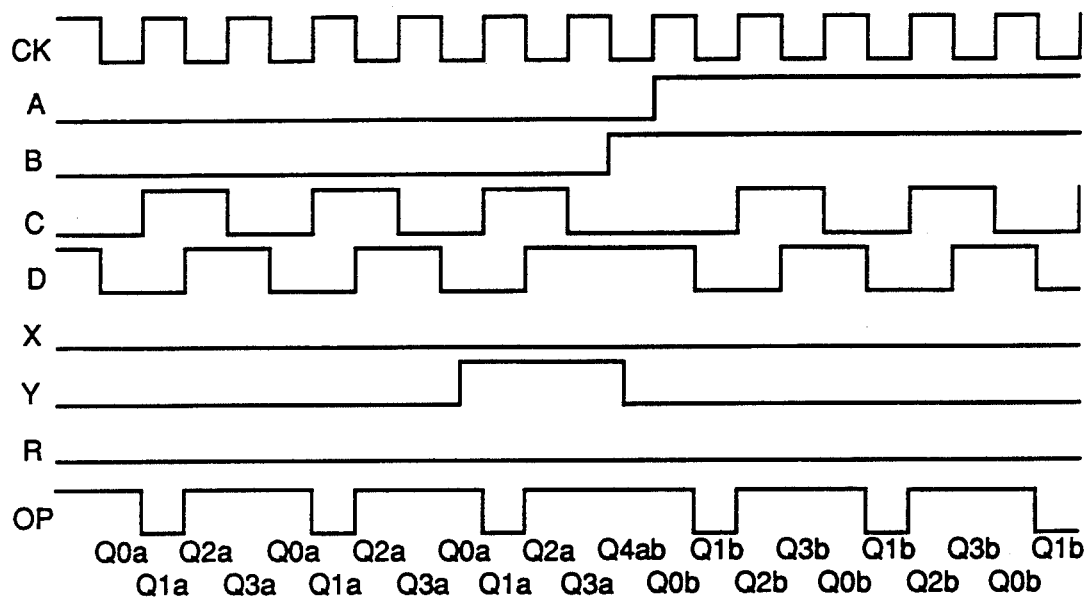

FIGS. 6 shows the scaler's state Q as it transits from the first regular loop "a" to the second regular loop "b" when the control signal "Y" is applied. When the phase of the sampling clock SC leads that of the regenerated clock RC by more than the preselected threshold, the control signal Y goes "1". The output of the NAND gate 53 goes "0" at Q3a and the NAND gate 54 changes its output from "0" to "1". The state B of the FF 32 then transits from "0" to "1" in response to the falling edge of the next internal clock pulse CK and the scaler's state Q transits from Q3a to Q4ab as shown in FIG. 3. Thereafter, the NAND gate 42 changes its output from "1" to "0" and the output of the NAND gate 45 transits from "0" to "1". The state A of the FF 31 changes from "0" to "1" in response to the rising edge of the next internal clock pulse CK and the scaler 21 transits to Q0b.

Normally only the one intermediate state Q4ab is required to correct the phase shift so that the control signal Y again becomes inactive. After the state Q0b is reached, neither of the FFs 31 or 32 continues to change its state (both output remains a "1"), until another phase correction is required. Thereafter, responding to each rising or falling edge of the internal clock pulses CK, the FFs 33 or 34 change their state, and, as shown in FIG. 6, the state Q transits "-Q1b-Q2b-Q3b-Q0b-Q1b-Q2b-Q3b- -" along the second regular loop "b".

Thus, as a result of a single application of the control signal Y, the transition states Q from the first regular loop "a" to the second loop "b" are "-Q0a-Q1a-Q2a-Q3a-Q4ab-Q0b-Q1b-Q2b-Q3b- -", and the state stream of the output clock pulses OP is "-1-0-1-1-1-1-0-1- -". During this transition, the Q4ab state is inserted so that a "1" is added to the state stream of the output clock pulses OP. In this stream, after one pattern of "1-0-1-1-1", the "1-0-1-1" is restored. Since the scaler 21 provides one output pulse during 2.5 clock cycles, it momentarily functions as a divide-by-2.5 frequency divider during the pattern of "1-0-1-1-1". However, it again reverts to a divide-by-2 frequency divider when the pattern of "1-0-1-1" is restored.

Figure 7:
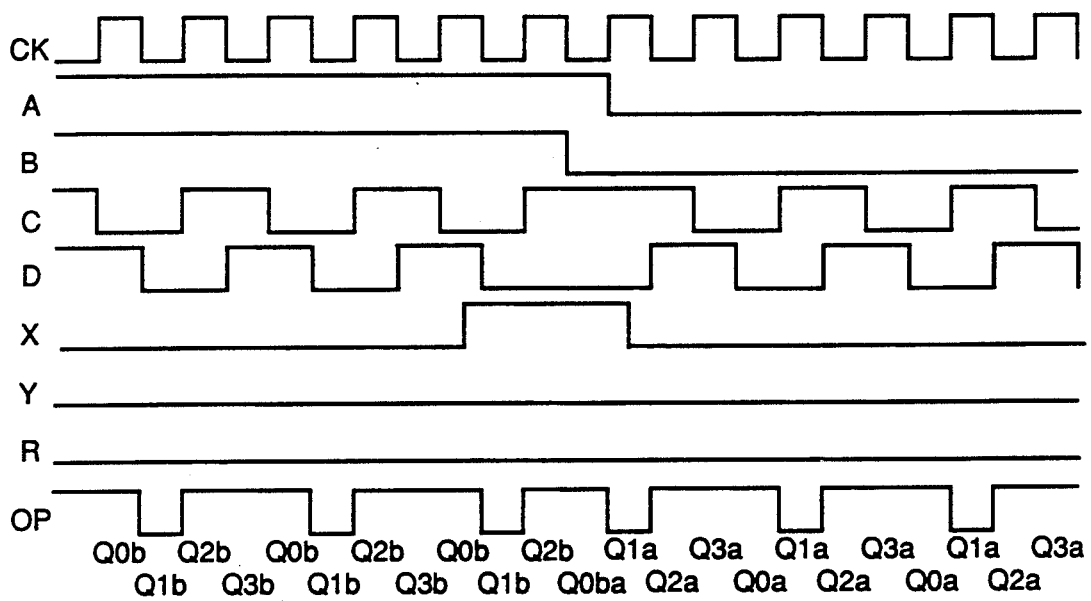

FIGS. 7 shows the scaler's state Q as it transits from the second regular loop "b" to the first regular loop "a" when the control signal X is applied in a manner similar to that described with reference to FIG. 5.

When because of an application of the control signal X, the state Q transits from loop "b" to loop "a" and continues the latter, the state stream of Q is "-Q0b-Q1b-Q2b-Q0ba-Q1a-Q2a-Q3a- - ", and the state stream of the output clock pulses OP is "-1-0-1-1-0-1-1- -". Thus the transition pattern is the same as that described with reference to FIG. 5, with the scaler 21 functioning in a similar manner.

Figure 8:
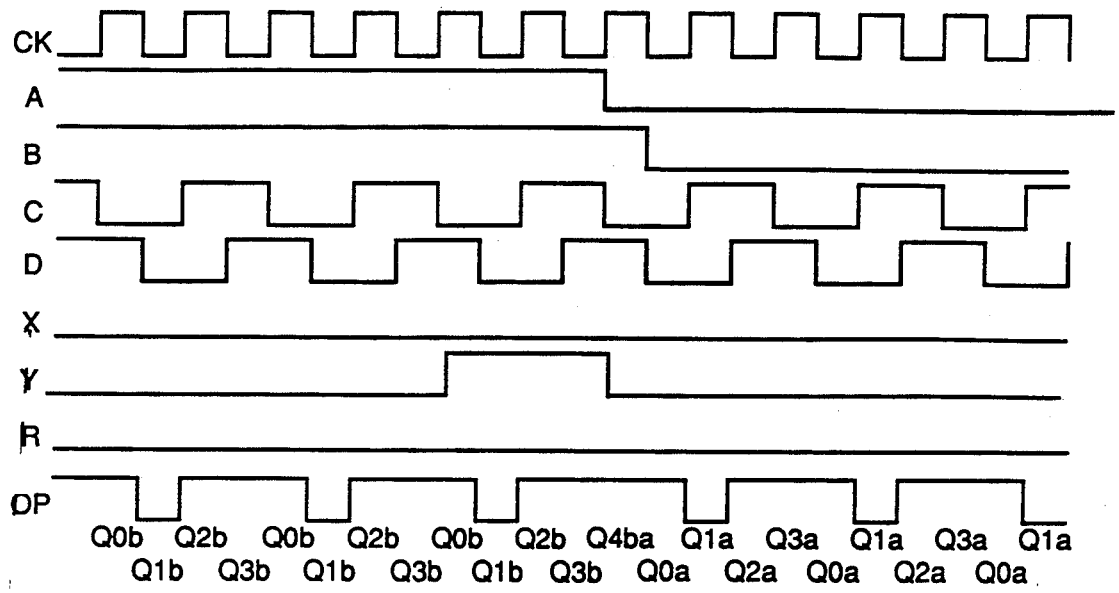

FIGS. 8 shows the scaler's state Q as it transits from the second regular loop "b" to the first regular loop "a" when the control signal Y is applied in a manner similar to that described with reference to FIG. 6.

When because of an application of the control signal Y, the state Q transits from loop "b" to "a" and continues the latter, the state stream of Q is "-Q0b-Q1b-Q2b-Q3b-Q4ba-Q0a-Q1a-Q2a-Q3a- -", and the state stream of the output clock pulses OP is "-1-0-1-1-1-1-0-1-1- -". Thus the transition pattern is the same as that described with reference to FIG. 6, with the scaler 21 functioning in a similar manner.

Figure 9:
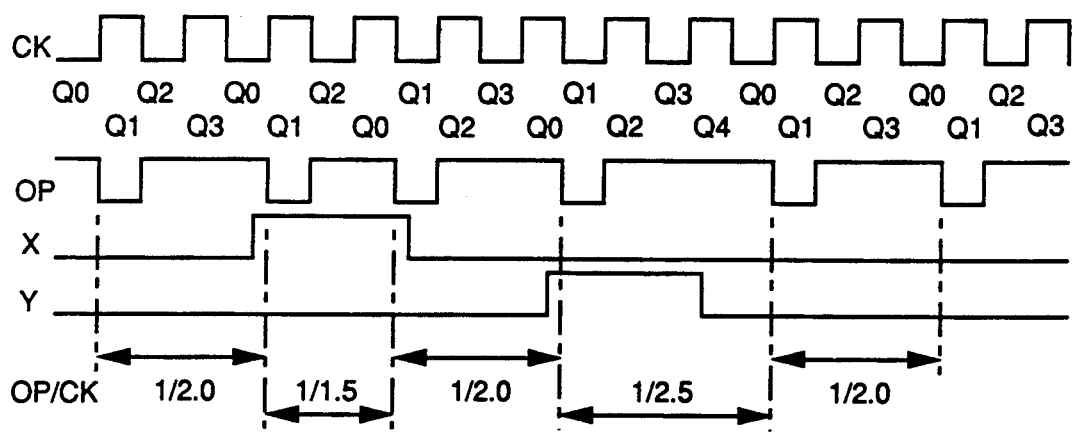

FIG. 9 shows the scaler's state Q for continuous transits between the two regular loops and the resultant frequency division when the control signal X or Y is applied. The scaler's state Q does not show the suffix indicating which loop intermediate state it is in.

If either control signal X or Y stays high "1", the scaler's state Q continues to transit through the intermediate state from one regular loop to the other. When such loop transitions occur, one "1" state is continuously deleted or added, with the resultant change in the frequency division from 2 to 1.5 or 2.5, respectively.

Summing up, the control signals X or Y become active whenever a phase correction is necessary. Accordingly, the magnitude of the phase correction is not critical, and the scaler performs frequency division variations of ±0.5 without the phase correction circuit malfunctioning. While each FF can transit only once during each clock cycle, the scaler can transit twice per clock cycle since it responds to both rising and falling edges of the clock pulses, so that the internal clock frequency is halved. If all FFs responded to the same clock edges, the clock frequency would have to be doubled, with the result that higher speed circuitry would be required.

Although the frequency division in the described embodiment is variable from 2, to 2.5 or 1.5, other frequency divisions can be readily obtained by modifying the gating and/or number of FFs.

What is claimed is:

1. A scaler having a selectively variable modulus, for receiving input clock pulses and generating a train of output pulses, the scaler comprising:
   a first set of D-type flip-flops responsive only to rising edges of said input clock pulses;
   a second set of D-type flip-flops responsive only to falling edges of said input clock pulses;
   a plurality of gates interconnected between the outputs and D-inputs of the flip-flops to control said scaler's state; and
   means for providing at least one control signal,
   wherein said scaler's state transits, on each half cycle of said input clock pulses, along one of two state transition loops, each loop generating output pulses having identical repetition rates, the output pulses of one loop being shifted in phase relative to the other loop by an odd number of half cycles of said input clock pulses; and
   said scaler's state transits in response to said control signal, from one of said two loops to the other through at least one intermediate state, so as to generate at least one output pulse at an alternative repetition rate, which differs from said identical repetition rates by the odd number of half cycles of the input clock pulses.

2. A scaler of claim 1, wherein said control signal is a set of first and second control signals and each of said sets of D-type flip-flops has two D-type flip flops;
   said scaler's state is continuously changed in response to said input clock pulses, as it transits along one of said two state transition loops without changing the state of one flip-flop of each set;
   said alternative repetition rate in response to said first and second control signals respectively, includes first and second repetition rates; and
   said first and second repetition rates are lower and higher, respectively, than said identical repetition rates.

3. A scaler of claim 2, wherein the pattern according to said identical repetition rates is "1-0-1-1" and according to said first and second repetition rates are "1-0-1" and "1-0-1-1-1", respectively.

4. A scaler of claim 2, wherein said scaler's frequency division is 2 corresponding to said identical repetition rates and is 1.5 and 2.5 corresponding to said first and second repetition rates, respectively.

TABLE 1

| STATE ABCD | NEXT STATE | | | | | | | |
|---|---|---|---|---|---|---|---|---|
| | X = 0, Y = 0 | | X = 1, Y = 0 | | X = 0, Y = 1 | | X = 1, Y = 1 | |
| | ABCD ↑EDGE | ABCD ↓EDGE | ABCD ↑EDGE | ABCD ↓EDGE | ABCD ↑EDGE | ABCD ↓EDGE | ABCD ↑EDGE | ABCD ↓EDGE |
| 0000§ | 0010§ | 0000 | 0010§ | 0000 | 0010§ | 0000 | 0010 | 0000 |
| 0001§ | 0001 | 0000§ | 0001 | 0000§ | 0001 | 0101§ | 0001 | 0101 |
| 0010§ | 0010 | 0011§ | 0010 | 0011§ | 0010 | 0011§ | 0010 | 0011 |
| 0011§ | 0001§ | 0010 | 1001§ | 0010 | 0001§ | 0111 | 1001 | 0111 |
| 0100 | 0110 | 0000 | 0110 | 0000 | 0110 | 0000 | 0110 | 0000 |
| 0101§ | 1101§ | 0000§ | 1101§ | 0000§ | 1101§ | 0000§ | 1101 | 0000 |
| 0110 | 0110 | 0011 | 0110 | 0010 | 0110 | 0011 | 0110 | 0010 |
| 0111 | 1101 | 0010 | 1101 | 0010 | 1101 | 0010 | 1101 | 0010 |
| 1000 | 0010 | 1000 | 0010 | 1000 | 0010 | 1000 | 0010 | 1000 |
| 1001§ | 0001 | 1100§ | 0001 | 1100§ | 0001 | 1100§ | 0001 | 1100 |
| 1010§ | 0010§ | 1010 | 0010§ | 1010 | 0010§ | 1010 | 0010 | 1010 |
| 1011 | 0001 | 1010 | 1001 | 1010 | 0001 | 1010 | 1001 | 1010 |
| 1100§ | 1110§ | 1000 | 1110§ | 1000 | 1110§ | 1000 | 1110 | 1000 |
| 1101§ | 0101 | 1100§ | 0101 | 1100§ | 0101 | 1100§ | 0101 | 1100 |
| 1110§ | 1110 | 1111§ | 1110 | 1010§ | 1110 | 1111§ | 1110 | 1010 |
| 1111§ | 1101§ | 1110 | 1101§ | 1010 | 0101§ | 1110 | 0101 | 1010 |

TABLE 2

| FFs 31 - 34 | | | | SCALER 21 | OUTPUT CLOCK PULSE |
|---|---|---|---|---|---|
| A | B | C | D | Q | OP |
| 0 | 0 | 0 | 0 | Q0 | 1 |
| 0 | 0 | 0 | 1 | Q3 | 1 |
| 0 | 0 | 1 | 0 | Q1 | 0 |
| 0 | 0 | 1 | 1 | Q2 | 1 |
| 0 | 1 | 0 | 0 | N/A | — |
| 0 | 1 | 0 | 1 | Q4 | 1 |
| 0 | 1 | 1 | 0 | N/A | — |
| 0 | 1 | 1 | 1 | N/A | — |
| 1 | 0 | 0 | 0 | N/A | — |
| 1 | 0 | 0 | 1 | Q0 | 1 |
| 1 | 0 | 1 | 0 | Q0 | 1 |
| 1 | 0 | 1 | 1 | N/A | — |
| 1 | 1 | 0 | 0 | Q1 | 0 |
| 1 | 1 | 0 | 1 | Q0 | 1 |
| 1 | 1 | 1 | 0 | Q2 | 1 |
| 1 | 1 | 1 | 1 | Q3 | 1 |

* * * * *